United States Patent [19]

Sonobe

[11] Patent Number: 4,556,266

[45] Date of Patent: Dec. 3, 1985

[54] JUMPER WIRE MATERIAL

[75] Inventor: Toshimitsu Sonobe, Tokyo, Japan

[73] Assignee: Thomas & Betts Corporation, Raritan, N.J.

[21] Appl. No.: 578,712

[22] Filed: Feb. 9, 1984

[30] Foreign Application Priority Data

Feb. 9, 1983 [JP] Japan .............................. 58-16808[U]

[51] Int. Cl.⁴ ........................................... H01R 11/00
[52] U.S. Cl. ............................... 339/29 R; 174/117 R; 361/412
[58] Field of Search ................ 174/117 R; 339/17 R, 339/17 E, 17 L, 17 M, 19, 222; 361/412; 339/28, 29 R

[56] References Cited

U.S. PATENT DOCUMENTS

| | | | |
|---|---|---|---|
| 3,362,005 | 1/1968 | Corns | 339/4 |
| 3,508,187 | 4/1970 | Crimmins | 339/17 |
| 3,540,956 | 11/1970 | Arnold et al. | 174/117 F X |
| 3,601,755 | 8/1971 | Shiells, Jr. | 339/19 |
| 3,727,168 | 4/1973 | Henschen et al. | 339/17 |
| 3,904,934 | 9/1975 | Martin | 339/17 M X |
| 3,960,424 | 6/1976 | Weisenburger | 339/17 M |
| 3,997,229 | 12/1976 | Narozny | 339/19 |
| 4,059,849 | 11/1977 | Mitchell | 361/412 |
| 4,092,057 | 5/1978 | Walton | 339/17 |
| 4,187,606 | 2/1980 | Sinclair | 29/629 |
| 4,230,383 | 10/1980 | Burnstein et al. | 339/17 R |
| 4,295,700 | 10/1981 | Sado | 339/17 M X |

FOREIGN PATENT DOCUMENTS

| | | | |
|---|---|---|---|
| 1174395 | 7/1964 | Fed. Rep. of Germany | 339/19 |
| 2011190 | 7/1979 | United Kingdom | 339/17 R |

OTHER PUBLICATIONS

Maples, R. G.; Right-Angle Electrical Connector; IBM Technical Disclosure Bulletin; vol. 12; No. 6; Nov. 1969.

Primary Examiner—A. T. Grimley
Assistant Examiner—Morris H. Nimmo
Attorney, Agent, or Firm—Robert M. Rodrick; Salvatore J. Abbruzzese

[57] ABSTRACT

A jumper wire material for connecting a pair of printed circuit wiring boards and having, in addition, a function to serve as a spacer for holding the printed circuit wiring boards in a mutually spaced relationship, the jumper wire material being constructed with core wires arranged in parallel with each other at a predetermined pitch, an insulative covering of a solid and non-flexible plastic material, and ridges projectively provided in parallel with each other on a pair of mutually opposed side surfaces of the insulative covering, and extending along the core wires.

6 Claims, 5 Drawing Figures

JUMPER WIRE MATERIAL

CROSS-REFERENCE TO RELATED APPLICATION

Priority is claimed under 35 USC 119 to Japanese Utility Model Registration Application No. 16808/1983 filed on Feb. 9, 1983.

FIELD OF THE INVENTION

This invention relates to a jumper wire material to be used for connecting a couple of printed circuit wiring boards, and, more particularly, it is concerned with a wire material which has a function to serve as a spacer to be used when the printed circuit wiring boards are layed one on the other with a predetermined space interval between them.

BACKGROUND OF THE INVENTION

It has heretofore been required that, when two or more numbers of printed circuit wiring boards are stacked one on another, a space interval be maintained between the adjacent printed circuit wiring boards with spacers, each being in a columnar shape, interposed between these neighboring printed circuit wiring boards and fixed with threaded bolts so as to fasten them together mechanically.

However, with an electronic device becoming smaller and smaller in size, the printed circuit wiring boards used for it are also required to be small in size and be stacked in a multi-layered structure. As a consequence of this, it has become difficult to leave a space on the printed circuit wiring boards for fitting the spacers.

SUMMARY OF THE INVENTION

The present invention has been made under such circumstances, and attempts at solving the above-mentioned problem by constructing a jumper wire material for use in connecting a couple of printed circuit wiring boards in such a manner that it can also be utilized as the spacer.

According to the present invention, in general aspect of it, there is provided a jumper wire material comprising a plurality of core wires (2), each being spaced apart from the other with a predetermined pitch, and an insulative covering (1) of a plastic material to embed therein said core wires, characterized in that said insulative covering (1) of plastic material is solid and nonflexible, and has a plurality of ridges (3) projectively provided in parallel with each other on a pair of mutually opposed side surfaces of said insulative covering, and extending along said core wires (2).

The foregoing object, other objects as well as specific construction and function of the jumper wire material according to the present invention will become more apparent and understandable from the following detailed description of preferred embodiments thereof, when read in conjunction with the accompanying drawing.

DETAILED DESCRIPTION OF PREFERRED EMBODIMENTS

In the following, the present invention will be described in detail with reference to preferred embodiments thereof shown in the accompanying drawing.

Figure 1A:
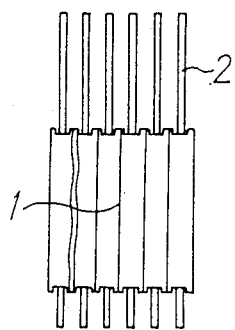
FIGS. 1A and 1B are respectively a plan view and an end view showing one embodiment of the present invention.
Figure 1B:
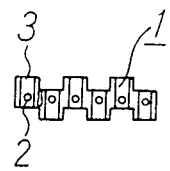

FIGS. 1A and 1B illustrate the first embodiment of the jumper wire material according to the present invention, wherein the core wires are disposed side by side within one and the same plane. In the drawing, a reference numeral 1 designates a covering made of a solid, non-flexible plastic material such as, for example, glass fiber reinforced polyester resin. A numeral 2 refers to a plurality of elongate core wires which are arranged in a mutually spaced apart relationship with a predetermined transverse pitch among them. A reference numeral 3 denotes a plurality of ridges arranged in parallel with each other, each ridge being projectively provided on a pair of mutually opposed side surfaces of the covering and extending continuously along the core wires. Depending on applications, however, the ridge 3 may be formed intermittently in the lengthwise direction of the core wire. In the illustrated embodiment, the ridges 3 are formed in such a manner that they may be projected up and down alternately on each pair of opposing side surfaces of the covering. Within each portion of the ridges 3 of the insulative covering 1, there is disposed an individual core wire in such a manner that all the core wires are layed side by side in one and the same plane, although such arrangement is not limitative for the purpose of the present invention.

In addition, when a hook is attached to a leading part of the core wire 2 projecting from the covering 1, it will serve effectively for tacking the wire material to the printed circuit wiring boards before the wire material is soldered to the printed boards.

Figure 2:
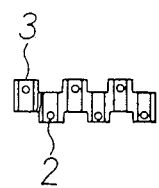
FIG. 2 is an end view showing another embodiment of the present invention.

FIG. 2 illustrates the second embodiment of the wire material according to the present invention, wherein the core wires 2 are arranged in a staggered form in correspondence to the alternate arrangement of the ridges 3. As the result, they are in a zig-zag arrangement.

Since, in this case, the core wires 2 are arranged in correspondence to the position of the ridges 3 so as to be embedded in the covering, as shown and described, the distance between the adjacent core wires becomes longer and the electrical insulation between them becomes enhanced in comparison with the embodiment shown in FIG. 1. In addition, since the core wires 2 are arranged in the staggered form, they become more durable against a load applied to the covering 1 in the direction perpendicular to it.

Figure 3:
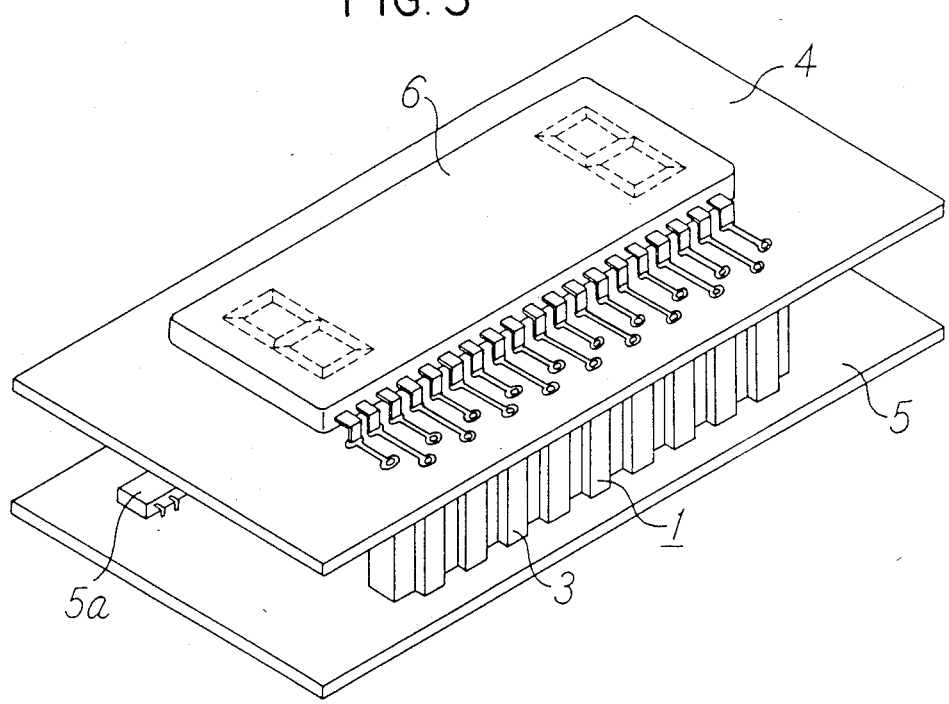
FIG. 3 is a perspective view of an assembly of printed circuit wiring boards, in which the jumper wire material of the second embodiment is used.

FIG. 3 illustrates an embodiment, wherein the jumper wire material of the second embodiment shown in FIG. 2 is used for connecting both a printed circuit wiring board 4 for a flat display element 6 and a printed circuit wiring board 5 for driving the display element. In the drawing, a reference numeral 5a designates an integrated circuit (IC) for driving the display element.

Figure 4:
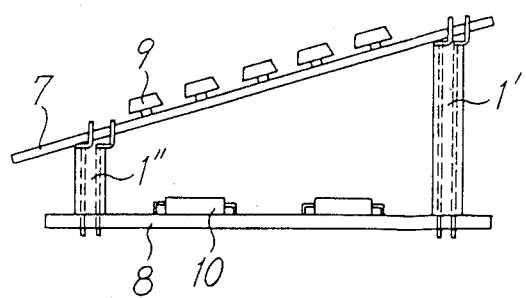
FIG. 4 is a side elevational view showing another application of the jumper wire material according to the present invention.

FIG. 4 shows an embodiment, wherein the jumper wire material according to the present invention is used for connecting a keyboard base plate 7 and a printed circuit wiring board 8 for driving and controlling. In the drawing, reference numerals 9 and 10 respectively designate operating keys and circuit components.

Although, in this embodiment, the wire materials 1' and 1" have different height, they can be used as equal as the other embodiment without deviating from the scope of the invention.

The jumper wire material of the construction as described above exhibits its particular effect to be mentioned in the following.

First, the jumper wire material of the present invention is covered with a solid, non-flexible material, and a plurality of ridges are projectively provided on a pair of mutually confronting side surfaces of the covering. On account of such construction, the covering for the wire material has sufficient thickness to effectively support the printed circuit wiring board thereon, hence it can firmly hold the printed circuit wiring board.

As a result of this, there is no necessity for separate spacers which have heretofore been indispensable for stacking the printed circuit wiring boards, hence no space is required to be set aside on the printed circuit wiring board for fitting the spacer, and the printed circuit wiring board can be made small in size with the consequent reduction in size of a device, on which the printed circuit wiring board is to be mounted. Moreover, the step for fitting the spacer becomes unnecessary, which facilitates assembly of the device and can reduce the manufacturing cost thereof.

Additionally, since the present invention is capable of making the covering thick enough as to be effective for stable support of the printed circuit wiring boards even at the step prior to the soldering, the working efficiency in their assembly is favorably high.

Further, according to the present invention, a plurality of the core wires can be embedded in each of the ridges formed on the covering, which enables the effective thickness of the covering to increase. Moreover, in this case, the pitch of the core wires in the adjacent ridges of the covering can be regulated to a predetermined value in conformity with thickness of the covering.

In addition, since the present invention constructs the main body of the wire material with the covering made of a solid and non-flexible material, it can also be used as a male connector having the lead wire projecting from the covering as a connecting pin.

Although, in the foregoing, the present invention has been described with particular reference to preferred embodiments thereof, it should be noted that these embodiments are merely illustrative and not restrictive, and that any changes and modifications may be made by those persons skilled in the art within the scope of the invention as recited in the appended claims.

I claim:

1. A jumper wire material comprising a plurality of elongate core wires, each being transversely spaced apart from the other by a predetermined pitch, and an insulative covering embedding said core wires therein, said insulative covering being solid and non-flexible, and having a plurality of ridges projectively provided in parallel with each other on a pair of mutually opposed side surfaces of said insulative covering, and extending longitudinally along said core wires, said covering having end surfaces at the longitudinal ends thereof for supporting electrical members to be electrically connected to said core wires.

2. The jumper wire material according to claim 1, wherein said insulative covering is a plastic material comprising a glass fiber reinforced polyester resin.

3. The jumper wire material according to claim 1 or 2, wherein said ridges are so arranged as to be projected alternately on the pair of mutually opposed side surfaces of said covering.

4. The jumper wire material according to claim 1, wherein said core wires are disposed in a common plane within said insulative covering in a mutually parallel and spaced relationship relative to each other.

5. The jumper wire material according to claim 1, wherein said core wires are disposed in said insulative covering in a staggered arrangement corresponding to said ridges.

6. The jumper wire material according to claim 1, wherein a hook is provided on a lead wire portion of said each core wire, and wherein said hook projects from said insulative covering.

* * * * *